(12) United States Patent
Shim et al.

(10) Patent No.: US 10,269,879 B2
(45) Date of Patent: Apr. 23, 2019

(54) DISPLAY DEVICE HAVING AN AUXILIARY ELECTRODE

(71) Applicant: LG DISPLAY CO., LTD., Seoul (KR)

(72) Inventors: Sung-Bin Shim, Yangsan-si (KR); Hye-Sook Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/791,081

(22) Filed: Oct. 23, 2017

(65) Prior Publication Data

US 2018/0122876 A1    May 3, 2018

(30) Foreign Application Priority Data

Oct. 31, 2016   (KR) .................. 10-2016-0143863

(51) Int. Cl.
*H01L 27/32* (2006.01)
*H01L 51/52* (2006.01)

(52) U.S. Cl.
CPC ...... *H01L 27/3246* (2013.01); *H01L 27/3276* (2013.01); *H01L 51/5203* (2013.01); *H01L 51/5237* (2013.01)

(58) Field of Classification Search
CPC ............. H01L 27/3246; H01L 27/3262; H01L 27/3276; H01L 51/5203; H01L 51/5228; H01L 51/5237; H01L 51/5246; H01L 27/3248; H01L 27/3279; H01L 51/525
See application file for complete search history.

(56) References Cited

U.S. PATENT DOCUMENTS

| 7,198,515 B2* | 4/2007 | Matsueda | ........... H01L 27/3276 439/577 |
| 7,943,938 B2* | 5/2011 | Miyagi | ................ G09G 3/3233 257/72 |

* cited by examiner

*Primary Examiner* — Roy Potter
(74) *Attorney, Agent, or Firm* — Seed IP Law Group LLP (57) ABSTRACT

A display device capable preventing or reducing luminance unevenness due to a voltage drop using an auxiliary electrode is provided. The display device may include a bank insulating layer that forms an under-cut region for connecting the auxiliary electrode to an upper electrode of a light-emitting structure. The bank insulating layer may include a first bank penetrating hole overlapping with the auxiliary electrode and a second bank penetrating hole spaced apart from the first bank penetrating hole. The second bank penetrating hole may overlap a lower penetrating hole of a lower passivation layer which is disposed between the auxiliary electrode and the bank insulating layer. The lower penetrating hole may overlap the auxiliary electrode.

20 Claims, 8 Drawing Sheets

DISPLAY DEVICE HAVING AN AUXILIARY ELECTRODE

CROSS-REFERENCE TO RELATED APPLICATION

This application claims the priority benefit of Korean Patent Application No. 10-2016-0143863, filed on Oct. 31, 2016, which is hereby incorporated by reference as if fully set forth herein.

BACKGROUND

Technical Field

The present disclosure relates to a display device capable of preventing or reducing luminance unevenness due to a voltage drop using an auxiliary electrode.

Description of the Related Art

Many electronic appliances, such as a monitor, a TV, a laptop computer, and a digital camera, include a display device to realize, or display, an image. For example, the display device may include a liquid crystal display device or an organic light-emitting display device.

The display device may include a light-emitting structure for realizing a specific color. For example, the light-emitting structure may include a lower electrode, a light-emitting layer and an upper electrode, which are sequentially stacked.

The display device may use an auxiliary electrode in order to prevent a voltage drop and a luminance unevenness due to a resistance of the upper electrode. The auxiliary electrode may be spaced apart from the light-emitting structure. For example, the auxiliary electrode may be disposed outside a data line supplying a data signal to the light-emitting structure. The auxiliary electrode may be electrically connected to the upper electrode of the light-emitting structure.

In the display device, various structures may be used to connect the upper electrode and the auxiliary electrode. For example, in the display device, an under-cut region may be formed on the auxiliary electrode using a bank insulating layer covering an edge of the lower electrode, so that a portion of the auxiliary electrode may be exposed by the light-emitting layer. Thus, in the display device, the upper electrode formed by a process having better step coverage than the light-emitting layer may be electrically connected to the portion of the auxiliary electrode in which the light-emitting layer is not deposited.

However, since a vertical distance of the under-cut region formed by the bank insulating layer is not large, an adhesive layer used in a process of attaching an upper substrate to a lower substrate in which the upper electrode is formed may not sufficiently flow to the under-cut region, so that a void may be formed in the under-cut region. In the display device, the void formed between the auxiliary electrode and the bank insulating layer may be seen as spots on the screen. Thus, in the display device, the quality of the image may be decreased by the void. Also, in the display device, since external moisture may permeate through the void, luminance unevenness occurs due to a decrease of the characteristics of some thin film transistors.

BRIEF SUMMARY

Accordingly, the present disclosure is directed to a display device having an auxiliary electrode that substantially obviates one or more problems due to limitations and disadvantages of the related art.

In various embodiments, the present disclosure provides a display device capable of preventing an occurrence of a void due to an adhesive layer in an under-cut region.

In various embodiments, the present disclosure provides a display device in which an under-cut region between an auxiliary electrode and a bank insulating layer may be completely filled by an adhesive layer used in an attaching process.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the various structures particularly pointed out in the written description and claims hereof as well as the appended drawings.

To achieve these objects and other advantages and in accordance with the purpose of the disclosure, as embodied and broadly described herein, there is provided in one or more embodiments a display device including an auxiliary electrode on a first substrate. A passivation layer is disposed on the auxiliary electrode. A first hole extends through the passivation layer and overlies at least a portion of the auxiliary electrode. A bank insulating layer is disposed on the passivation layer. A first bank layer hole extends through the bank insulating layer and partially overlies the first hole. A second bank layer hole extends through the bank insulating layer and overlies the first hole, and the second bank layer hole is spaced apart from the first bank layer hole. An over-coat layer is disposed between the passivation layer and the bank insulating layer.

A side surface of the second bank layer hole may overlie the first hole.

A plane size of the second bank layer hole may be smaller than a plane size of the first bank layer hole.

The second bank layer hole may be positioned adjacent to a side surface of the first bank layer hole.

A plane shape of the second bank layer hole may be a polygon of a same type as a plane shape of the first bank layer hole.

The plane shape of the first bank layer hole and the second bank layer hole may be a rectangular shape.

The first bank layer hole may have a rectangular shape, and the second bank layer hole may be positioned adjacent to a first side and a second side of the first bank layer hole.

A second substrate may be disposed on the bank insulating layer. An adhesive layer may be disposed between the bank insulating layer and the second substrate. The adhesive layer may extend between the auxiliary electrode and the bank insulating layer through the first bank layer hole and the second bank layer hole.

A light-emitting layer may be disposed on a first portion of the auxiliary electrode in the first hole, a second electrode may be disposed on the light-emitting layer, and the second electrode may contact a second portion of the auxiliary electrode in the first hole.

The light-emitting layer may be discontinuous in an undercut region between the bank insulating layer and the auxiliary electrode.

In further embodiments of the present disclosure, a display device includes an auxiliary electrode on a substrate. A passivation layer is disposed on the auxiliary electrode. A first hole extends through the passivation layer and exposes the auxiliary electrode. A bank insulating layer is disposed on the passivation layer. A second hole extends through the bank insulating layer and overlaps the auxiliary electrode, and a perimeter of the second hole overlaps the first hole. The perimeter of the second hole includes one or more protruding portions that extend the perimeter of the second hole outwardly in relation to adjacent portions of the perimeter.

The first hole may include a side surface that is adjacent to the one or more protruding portions of the perimeter of the second hole. The side surface of the first hole may extend in a straight line adjacent to the one or more protruding portions.

A thin film transistor may be disposed between the substrate and the passivation layer. The thin film transistor may be spaced apart from the auxiliary electrode. The auxiliary electrode may include a same material as one of a gate electrode, a source electrode and a drain electrode of the thin film transistor.

A first electrode may be coupled to the drain electrode of the thin film transistor. A light-emitting layer may be disposed on the first electrode. A second electrode may be disposed on the light-emitting layer, and the second electrode may contact the auxiliary electrode in the first hole.

In further embodiments, the present disclosure provides a display device that includes a first substrate. An auxiliary electrode is disposed on the first substrate. A passivation layer is disposed on the auxiliary electrode, and the auxiliary electrode is exposed by a first hole that extends through the passivation layer. A bank insulating layer is disposed on the passivation layer. A second hole extends through the bank insulating layer over a first portion of the auxiliary electrode. An undercut region is formed between the bank insulating layer and a second portion of the auxiliary electrode, and the bank insulating layer has a surface that faces the second portion of the auxiliary electrode in the undercut region. A third hole extends through the bank insulating layer in the undercut region.

A plurality of third holes may extend through the bank insulating layer in the undercut region.

A first portion of the plurality of third holes may be disposed adjacent to a first side of the second hole, and a second portion of the plurality of third holes may be disposed adjacent to a second side of the second hole.

A second substrate may be disposed on the bank insulating layer. An adhesive layer may be disposed between the bank insulating layer and the second substrate, and the adhesive layer may extend into the undercut region through the second hole and the third hole.

A transistor may be disposed on the first substrate. A first electrode may be coupled to the transistor. A light-emitting layer may be disposed on the first electrode, and a second electrode may be disposed on the light-emitting layer. The second electrode may contact the second portion of the auxiliary electrode in the undercut region.

The light-emitting layer may be discontinuous in the undercut region.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiment(s) of the disclosure and together with the description serve to explain the principles of the disclosure. In the drawings.

DETAILED DESCRIPTION

Hereinafter, details related to the above objects, technical configurations, and operational effects of the embodiments of the present disclosure will be clearly understood by the following detailed description with reference to the drawings, which illustrate some embodiments of the present disclosure. Here, the embodiments of the present disclosure are provided in order to allow the technical sprit of the present disclosure to be satisfactorily transferred to those skilled in the art, and thus the present disclosure may be embodied in other forms and is not limited to the embodiments described below.

In addition, the same or similar elements may be designated by the same reference numerals throughout the specification, and in the drawings, the lengths and thickness of layers and regions may be exaggerated for convenience. It will be understood that, when a first element is referred to as being "on" a second element, although the first element may be disposed on the second element so as to come into contact with the second element, a third element may be interposed between the first element and the second element.

Here, terms such as, for example, "first" and "second" may be used to distinguish any one element with another element. However, the first element and the second element may be arbitrarily named according to the convenience of those skilled in the art without departing the technical sprit of the present disclosure.

The particular terms used in the specification of the present disclosure are merely used in order to describe particular embodiments, and are not intended to limit the scope of the present disclosure. For example, an element described in the singular form is intended to include a plurality of elements unless the context clearly indicates otherwise. In addition, in the specification of the present disclosure, it will be further understood that the terms "comprises" and "includes" specify the presence of stated features, integers, steps, operations, elements, components, and/or combinations thereof, but do not preclude the presence or addition of one or more other features, integers, steps, operations, elements, components, and/or combinations.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Figure 1:
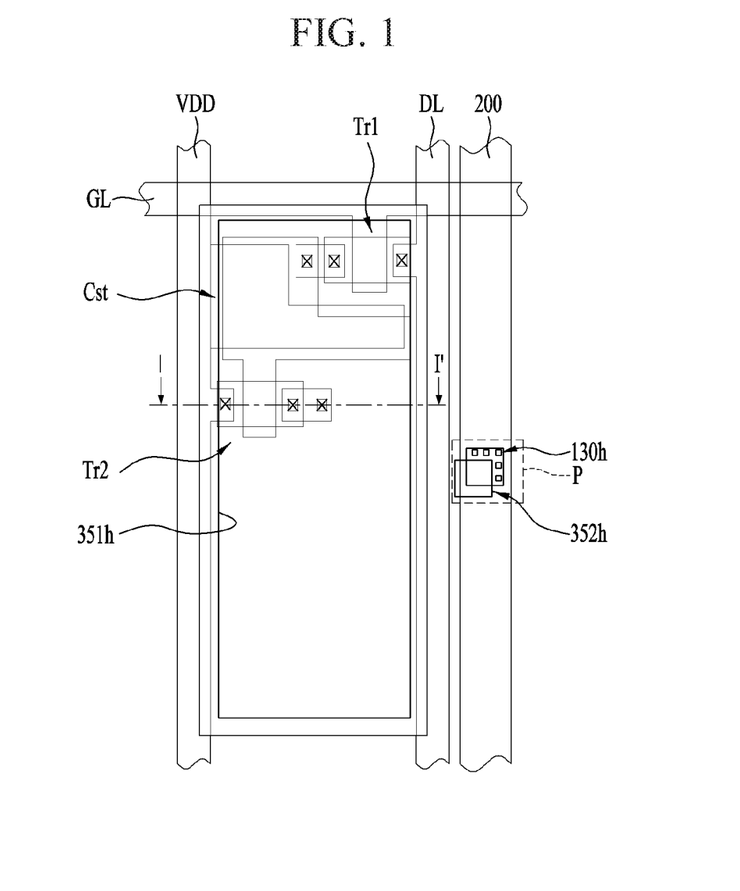
FIG. 1 is a plane view schematically showing a display device according to one or more embodiments of the present disclosure.
Figure 2:
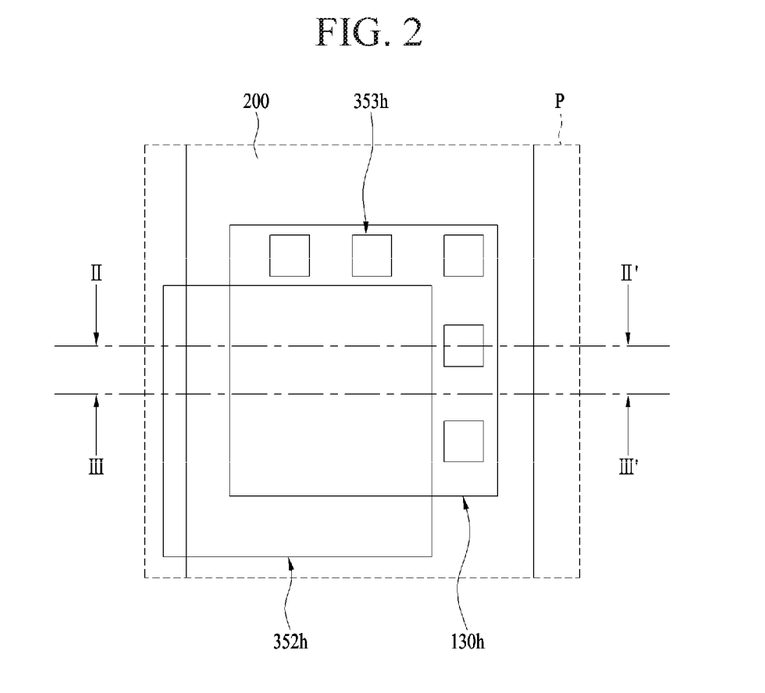
FIG. 2 is an enlarged view of the region P shown in FIG. 1.
Figure 3A:
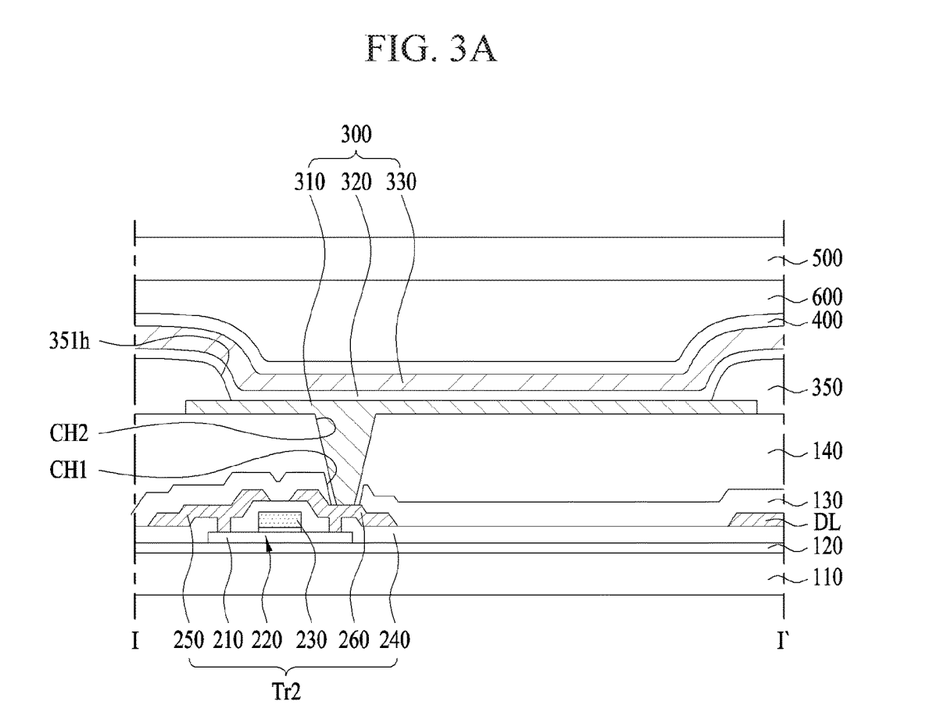
FIG. 3A is a cross-sectional view taken along the line I-I' of FIG. 1.
Figure 3B:
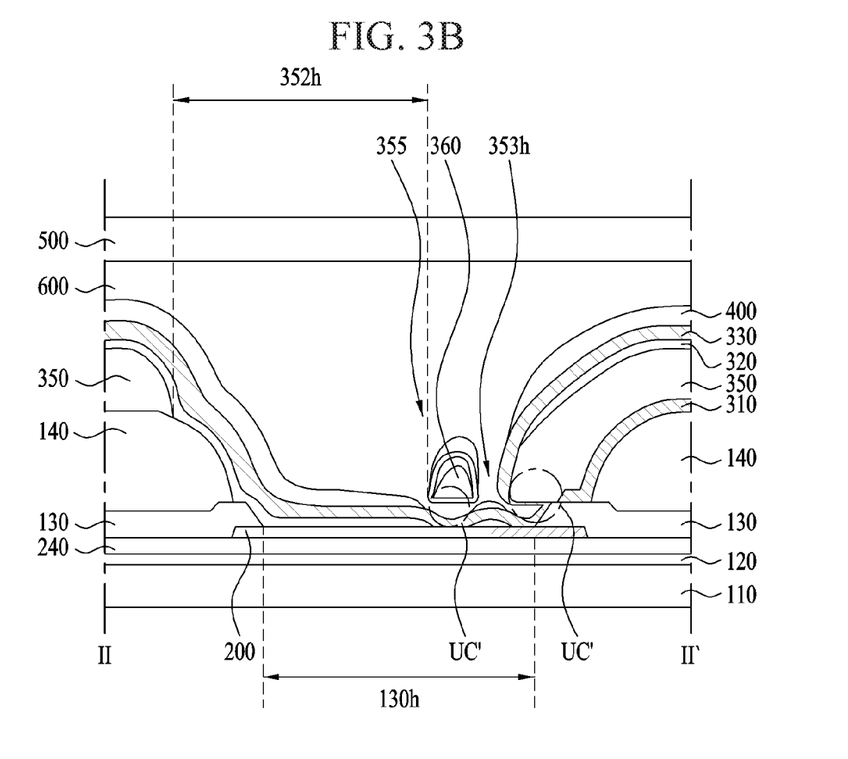
FIG. 3B is a cross-sectional view taken along the line II-II' of FIG. 2.
Figure 3C:
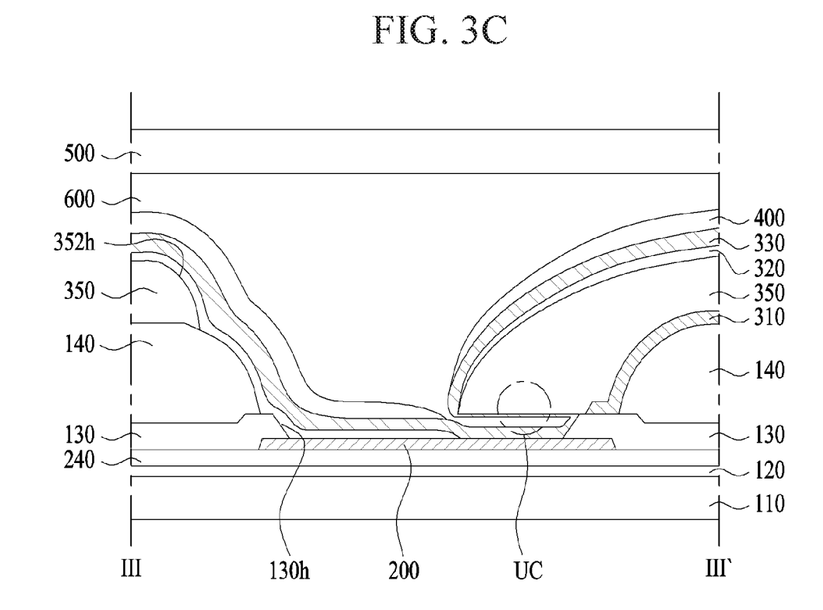
FIG. 3C is a cross-sectional view taken along the line III-III' of FIG. 2.

FIG. 1 is a plane view schematically showing a display device according to one or more embodiments of the present disclosure. FIG. 2 is an enlarged view of the region P shown in FIG. 1. FIG. 3A is a cross-sectional view taken along the line I-I' of FIG. 1. FIG. 3B is a cross-sectional view taken along the line II-II' of FIG. 2. FIG. 3C is a cross-sectional view taken along the line III-III' of FIG. 2.

Referring to FIGS. 1, 2 and 3A to 3C, the display device according to embodiments of the present disclosure may comprise a lower substrate 110, thin film transistors Tr1 and Tr2, a lower passivation layer 130, an over-coat layer 140, an auxiliary electrode 200, a light-emitting structure 300, a bank insulating layer 350, an upper substrate 500 and an adhesive layer 600.

The lower substrate 110 may support the thin film transistors Tr1 and Tr2, the auxiliary electrode 200 and the light-emitting structures 300. The lower substrate 110 may include an insulating material. For example, the lower substrate 110 may include glass or plastic.

A plurality of gate lines GL, a plurality of data lines DL and a plurality of power supply lines VDD may be disposed on the lower substrate 110. The data lines DL may intersect the gate lines GL. The power supply lines VDD may be parallel with the gate lines GL or the data lines DL. For example, the power supply lines VDD may intersect the gate lines GL. As used herein, the term "intersect" does not require physical connection or contact between intersecting elements. Rather, the elements may intersect one another in an overlapping manner, with one or more elements disposed therebetween.

The gate line GL, the data line DL and the power supply line VDD may define pixel areas. For example, each of the pixel areas may be at least partially surrounded by a gate line GL, a data line DL and a power supply line VDD. A circuit for controlling the light-emitting structure 300 may be disposed in each pixel area. For example, a selection thin film transistor Tr1, a driving thin film transistor Tr2 and a storage capacitor Cst may be disposed in each pixel area.

The selection thin film transistor Tr1 can turn on/off the driving thin film transistor Tr2 according to a gate signal applied through the gate line GL. The driving thin film transistor Tr2 can supply driving current to the corresponding light-emitting structure 300 according to a signal of the selection thin film transistor Tr1. For example, the selection thin film transistor Tr1 may have the same structure as the driving thin film transistor Tr2. The storage capacitor Cst can maintain the signal of the selection thin film transistor Tr1 applied to the driving thin film transistor Tr2 for a predetermined period.

The driving thin film transistor Tr2 may include a semiconductor pattern 210, a gate insulating layer 220, a gate electrode 230, an interlayer insulating layer 240, a source electrode 250 and a drain electrode 260.

The semiconductor pattern 210 may be disposed close to the lower substrate 110. The semiconductor pattern 210 may include a semiconductor material. For example, the semiconductor pattern 210 may include amorphous silicon or poly-silicon. For example, the semiconductor pattern 210 may include an oxide semiconductor material such as indium gallium zinc oxide (IGZO). The semiconductor pattern 210 may include a source region, a drain region and a channel region. The channel region may be disposed between the source region and the drain region.

The display device according to the embodiment of the present disclosure may further include a buffer layer 120 between the lower substrate 110 and the semiconductor pattern 210. The buffer layer 120 may be extended beyond the thin film transistors Tr1 and Tr2. For example, the buffer layer 120 may cover the entire surface of the lower substrate 110. The buffer layer 120 may include an insulating material. For example, the buffer layer 120 may include silicon oxide.

The gate insulating layer 220 may be disposed on the semiconductor pattern 210. The gate insulating layer 220 may overlap the channel region of the semiconductor pattern 210. The gate insulating layer 220 may include an insulating material. For example, the gate insulating layer 220 may include silicon oxide and/or silicon nitride. The gate insulating layer 220 may include a high-K material. For example, the gate insulating layer 220 may include hafnium oxide (HfO) or titanium oxide (TiO). The gate insulating layer 220 may have a multi-layer structure.

The gate electrode 230 may be disposed on the gate insulating layer 220. The gate electrode 230 may overlap the channel region of the semiconductor pattern 210. For example, the gate insulating layer 220 may include a side surface continuous with a side surface of the gate electrode 230. The gate electrode 230 may include a conductive material. For example, the gate electrode 230 may include a metal, such as aluminum (Al), chrome (Cr), molybdenum (Mo) and tungsten (W).

The interlayer insulating layer 240 may be disposed on the semiconductor pattern 210 and the gate electrode 230. The interlayer insulating layer 240 may be extended beyond the semiconductor pattern 210. The gate insulating layer 220 and the gate electrode 230 may be completely surrounded by the interlayer insulating layer 240. For example, the interlayer insulating layer 240 may be in direct contact with the buffer layer 120 at the outside edges of the semiconductor pattern 210. The interlayer insulating layer 240 may include an insulating material. For example, the interlayer insulating layer 240 may include silicon oxide and/or silicon nitride. The interlayer insulating layer 240 may have a multi-layer structure.

The source electrode 250 and the drain electrode 260 may be disposed on the interlayer insulating layer 240. The drain electrode 260 may be spaced from the source electrode 250. The source electrode 250 may be electrically connected to the source region of the semiconductor pattern 210. The drain electrode 260 may be electrically connected to the drain region of the semiconductor pattern 210. For example, contact holes may extend through the interlayer insulating layer 240 to expose the source region and the drain region of the semiconductor pattern 210, and the source electrode 250 and the drain electrode 260 may extend through the contact holes to contact the source region and the drain region, respectively.

The source electrode 250 and the drain electrode 260 may include a conductive material. For example, the source electrode 250 and the drain electrode 260 may include metal, such as aluminum (Al), chrome (Cr), molybdenum (Mo) and tungsten (W). The drain electrode 260 may include the same material as the source electrode 250. For example, the drain electrode 260 may be formed by the same etching process as the source electrode 250. The gate electrode 230 may include a material different from the source electrode 250 and the drain electrode 260.

The display device according to embodiments of the present disclosure is described with the semiconductor pattern 210 of each thin film transistor Tr1 and Tr2 being disposed close to the lower substrate 110. However, in a display device according to another embodiment of the present disclosure, the semiconductor pattern 210 of each the thin film transistor Tr1 and Tr2 may be disposed between the gate electrode 230 and the source/drain electrodes 250 and 260.

The auxiliary electrode 200 may be disposed on the lower substrate 110. The auxiliary electrode 200 may be spaced apart from the thin film transistors Tr1 and Tr2. The auxiliary electrode 200 may be parallel with the gate line GL and/or the data line DL. For example, the auxiliary electrode 200 may be parallel with the data line DL, as shown in FIG. 1. The auxiliary electrode 200 may be disposed outside of the data line DL. That is, the data line DL may be between the auxiliary electrode 200 and the thin film transistor Tr1, as shown.

The auxiliary electrode 200 may include a same material as one of conductive materials constituting the thin film transistors Tr1 and Tr2. For example, the auxiliary electrode 200 may be formed using a process of forming the thin film transistors Tr1 and Tr2. The auxiliary electrode 200 may include a same material as one of the gate electrode 230, the source electrode 250 and the drain electrode 260 of the thin film transistors Tr1 and Tr2. For example, the auxiliary electrode 200 may include a same material as the source electrode 250 and the drain electrode 260 of the thin film transistors Tr1 and Tr2. The auxiliary electrode 200 may be disposed on the interlayer insulating layer 240.

The lower passivation layer 130 may be disposed on the thin film transistors Tr1 and Tr2 and the auxiliary electrode 200. The lower passivation layer 130 may include an insulating material. For example, the lower passivation layer 130 may include silicon oxide and/or silicon nitride. The lower passivation layer 130 may have a multi-layer structure.

A first contact hole CH1 and a lower penetrating hole 130h may be formed through the lower passivation layer 130.

The first contact hole CH1 of the lower passivation layer 130 may overlap the driving thin film transistor Tr2, as shown in FIG. 3A. For example, the first contact hole CH1 of the lower passivation layer 130 may expose the drain electrode 260 of the driving thin film transistor Tr2.

The lower penetrating hole 130h of the lower passivation layer 130 may overlap the auxiliary electrode 200, as shown in FIG. 3B. The auxiliary electrode 200 may be exposed by the lower penetrating hole 130h of the lower passivation layer 130. The lower passivation layer 130 may cover an edge of the auxiliary electrode 200.

The over-coat layer 140 may be disposed on the lower passivation layer 130. The over-coat layer 140 may remove a thickness difference caused by the thin film transistors Tr1 and Tr2. The over-coat layer 140 may include an organic insulating material. For example, the over-coat layer 140 may include a thermosetting resin.

The light-emitting structure 300 may realize a specific color. For example, the light-emitting structure 300 may include a lower electrode 310, a light-emitting layer 320 and an upper electrode 330, which are sequentially stacked.

The light-emitting structure 300 may be controlled by the thin film transistors Tr1 and Tr2. For example, the lower electrode 310 of the light-emitting structure 300 may be electrically connected to the drain electrode 260 of the driving thin film transistor Tr2. The light-emitting structure 300 may be disposed on the over-coat layer 140. For example, as shown in FIG. 3A, a second contact hole CH2 may be formed through the over-coat layer 140 and may be aligned with the first contact hole CH1 of the lower passivation layer 130. The lower electrode 310 may be extend into the first and second contact holes CH1, CH2, and may contact a side surface of the first contact hole CH1 and a side surface of the second contact hole CH2. As shown in FIG. 3A, the over-coat layer 140 may form the side surfaces of the first contact hole CH1 and the second contact hole CH2.

The lower electrode 310 may include a conductive material. The lower electrode 310 may include a material having high reflectance. For example, the lower electrode 310 may include a metal, such as aluminum (Al) and argentum (Ag). The lower electrode 310 may have a multi-layer structure. For example, the lower electrode 310 may include a structure in which a reflective electrode including a material having high reflectance is disposed between transparent electrodes including a transparent conductive material such as indium tin oxide (ITO) and indium zinc oxide (IZO).

The light-emitting layer 320 may generate light having luminance corresponding to a voltage difference between the lower electrode 310 and the upper electrode 330. For example, the light-emitting layer 320 may include an emitting material layer (EML) having an emission material. The emission material may include an organic material, an inorganic material or a hybrid material. For example, the display device according to the embodiment of the present disclosure may be an organic light-emitting display device having an organic light-emitting layer 320.

The light-emitting layer 320 may have a multi-layer structure in order to increase luminous efficacy. For example, the light-emitting layer 320 may further include at least one of a hole injection layer (HIL), a hole transporting layer (HTL), an electron transporting layer (ETL), and an electron injection layer (EIL).

The upper electrode 330 may include a conductive material. The upper electrode 330 may include a material different from the lower electrode 310. For example, the upper electrode 330 may include only a transparent material. Thus, in the display device according to the embodiment of the present disclosure, the light generated by the light-emitting layer 320 may be emitted to the outside through the upper electrode 330.

The bank insulating layer 350 may insulate each lower electrode 310 from the adjacent pixel area. For example, the bank insulating layer 350 may cover one or more edges of the lower electrode 310. A pixel penetrating hole 351h may be formed through the bank insulating layer 350 and may expose a portion of the lower electrode 310. The light-emitting layer 320 and the upper electrode 330 may be stacked on a surface of the lower electrode 310 exposed by the pixel penetrating hole 351h of the bank insulating layer 350.

A first bank penetrating hole 352h and a second bank penetrating hole 353h may further be formed through the bank insulating layer 350. The first bank penetrating hole 352h and the second bank penetrating hole 353h may overlap the auxiliary electrode 200, as shown in FIGS. 2 and 3B. The second bank penetrating hole 353h may be spaced apart from the first bank penetrating hole 352h. A plurality of second bank penetrating holes 353h may be provided, as shown in FIG. 2.

The first bank penetrating hole 352h may partially expose a side surface of the lower penetrating hole 130h. For example, the first bank penetrating hole 352h may include a side surface overlapping with the over-coat layer 140 and a side surface disposed over the lower penetrating hole 130h. The first bank penetrating hole 352h may include a side surface intersecting a side surface of the lower penetrating hole 130h. For example, as shown in the plan view of FIG. 2, the first bank penetrating hole 352h may partially overlap the lower penetrating hole 130h, such that the side surfaces of the first bank penetrating hole 352h include portions that are overlapping the lower penetrating hole 130*h*, and other portions that do not overlap the lower penetrating hole 130*h*.

An end portion of the bank insulating layer 350 disposed close to a side surface of the first bank penetrating hole 352*h* which is disposed overlying the lower penetrating hole 130*h* may overlap with the auxiliary electrode 200, and may not overlap with the lower passivation layer 130. That is, as shown in FIGS. 3B and 3C, the first bank penetrating hole 352*h* may extend between a first side of the bank insulating layer 350 and a second side of the bank insulating layer 350, as shown by the brackets indicating the first bank penetrating hole 352*h*. As shown in FIG. 3C, an end portion of the bank insulating layer 350 that forms the second side (e.g., the right side) of the bank insulating layer 350 overlies the auxiliary electrode 200 in the region of the lower penetrating hole 130*h*, in which the auxiliary electrode 200 is not covered by the lower passivation layer 130. The end portion of the bank insulating layer 350 disposed close to the side surface of the first bank penetrating hole 352*h* which is disposed overlapping the lower penetrating hole 130*h* may include an under-cut region UC on a lower surface of the bank insulating layer 350 facing the auxiliary electrode 200. The lower surface of the bank insulating layer 350 may be exposed by the lower passivation layer 130 in the under-cut region UC.

A plane shape of the first bank penetrating hole 352*h* may be the same as a plane shape of the lower penetrating hole 130*h*. A plane size of the first bank penetrating hole 352*h* may be the same as a plane size of the lower penetrating hole 130*h*, however, the first bank penetrating hole 352*h* may be positioned in an offset manner with respect to the lower penetrating hole 130*h*, such that the first bank penetrating hole 352*h* only partially overlaps the lower penetrating hole 130*h*, as shown in FIG. 2. For example, the center of the first bank penetrating hole 352*h* may be different from the center of the lower penetrating hole 130*h*. The first bank penetrating hole 352*h* may be a polygon of a same type as a plane shape of the lower penetrating hole 130*h*. For example, the first penetrating hole 352*h* and the lower penetrating hole 130*h* may each have a rectangular shape.

The second bank penetrating hole 353*h* may overlap the lower penetrating hole 130*h*, as shown in FIG. 2. A side surface of the second bank penetrating hole 353*h* may be disposed overlapping the lower penetrating hole 130*h*. The second bank penetrating hole 353*h* may partially penetrate the under-cut region UC formed by the first bank penetrating hole 352*h*, such that the under-cut region UC is separated into under-cut portions UC' by the second bank penetrating hole 353*h* (FIG. 3B). A structure 355, which includes a portion of the bank insulating layer 150 and layers formed thereon, is formed between the first and second bank penetrating holes 352*h*, 353*h*. A horizontal distance of the under-cut region UC formed by the first bank penetrating hole 352*h* may be reduced due to the second bank penetrating hole 353*h* so that the under-cut region UC includes only the under-cut portions UC' in regions adjacent to the second bank penetrating hole.

A plane size of the second bank penetrating hole 353*h* may be smaller than the plane size of the first bank penetrating hole 352*h*, as shown in FIG. 2. A plane size of the second bank penetrating hole 353*h* may be smaller than the plane size of the lower penetrating hole 130*h*. For example, the display device according to embodiments of the present disclosure may include a plurality of the second bank penetrating holes 353*h* disposed adjacent to one or more side surfaces of the first bank penetrating hole 352*h*. The second bank penetrating hole 353*h* may be a polygon of a same type as the plane shape of the first bank penetrating hole 352*h*. For example, the second bank penetrating hole 353*h* may have a rectangular shape.

The light-emitting layer 320 and the upper electrode 330 may extend onto the bank insulating layer 350. The light-emitting layer 320 and the upper electrode 330 may extend onto the auxiliary electrode 200 through the first bank penetrating hole 352*h*.

The light-emitting layer 320 may cut-off in the under-cut region UC due to the undercut of the bank insulating layer 350, such that the light-emitting layer 320 is discontinuous in the under-cut region UC between the bank insulating layer 350 and the auxiliary electrode 200. The lower surface of the bank insulating layer 350 in the under-cut region UC may be not covered by the light-emitting layer 320. In the under-cut region UC, the light-emitting layer 320 may be not formed on a surface of the auxiliary electrode 200 overlapping with the bank insulating layer 350. The auxiliary electrode 200 overlapping with the bank insulating layer 350 may be exposed by the light-emitting layer 320 in the under-cut region UC.

The upper electrode 330 may extend along the light-emitting layer 320. The upper electrode 330 may have better step coverage than the light-emitting layer 320. For example, the upper electrode 330 may extend onto the lower surface of the bank insulating layer 350 in the under-cut region UC. In the under-cut region UC, the upper electrode 330 may cover the surface of the auxiliary electrode 200 overlapping with the bank insulating layer 350. The surface of the auxiliary electrode 200 exposed by the light-emitting layer 320 may be covered by the upper electrode 330. The auxiliary electrode 200 may be connected to the upper electrode 330 due to the under-cut region UC, which is where the upper electrode 330 contacts the auxiliary electrode 200.

The upper substrate 500 may be disposed on the light-emitting structure 300. The upper substrate 500 may be disposed opposite the lower substrate 110. The upper substrate 500 may include an insulating material. The upper substrate 500 may include a transparent material. For example, the upper substrate 500 may include glass or plastic.

The adhesive layer 600 may be disposed between the lower substrate 110 and the upper substrate 500. The upper substrate 500 may be coupled to the lower substrate 110 by the adhesive layer 600. The adhesive layer 600 may include an adhesive material. For example, the adhesive layer 600 may include a curable material. For example, the adhesive layer 600 may include a thermosetting resin.

The adhesive layer 600 may fill a space between the lower substrate 110 and the upper substrate 500. The adhesive layer 600 may be in direct contact with the upper electrode 330 on the auxiliary electrode 200 through the lower penetrating hole 130*h* and the first bank penetrating hole 352*h*. The adhesive layer 600 may extend into the under-cut region UC formed by the bank insulating layer 350. The adhesive layer 350 may extend into the under-cut region UC through the second bank penetrating hole 353*h*.

In the display device according to embodiments of the present disclosure, the second bank penetrating hole 353*h* may be disposed in the under-cut region UC formed by the first bank penetrating hole 352*h*. Thus, in the display device according to embodiments of the present disclosure, the horizontal distance of the under-cut region UC may be partially reduced due to the second bank penetrating hole 353*h*. Thus, in the display device according to embodiments of the present disclosure, the adhesive layer 600 for attaching the upper substrate 500 to the lower substrate 110 may fill the under-cut region UC, relatively easily. Also, in the display device according to embodiments of the present disclosure, since the adhesive layer 600 may flow to the under-cut region UC through the first bank penetrating hole 352h and the second bank penetrating hole 353h, the inflow path of the adhesive layer 600 into the under-cut region UC may be varied, so that the adhesive layer 600 may quickly fill the under-cut region UC. Thereby, in the display device according to embodiments of the present disclosure, the occurrence of the void by the adhesive layer 600 may be prevented or reduced.

The display device according to embodiments of the present disclosure may further include an upper passivation layer 400 between the light-emitting structure 300 and the adhesive layer 600. The upper passivation layer 400 may prevent or otherwise reduce the effects of external impact and moisture on the thin film transistor Tr1 and Tr2 and the light-emitting structure 300. The upper passivation layer 400 may include an insulating material. For example, the upper passivation layer 400 may include silicon oxide and/or silicon nitride. The upper passivation layer 400 may have a multi-layer structure.

Figure 4:
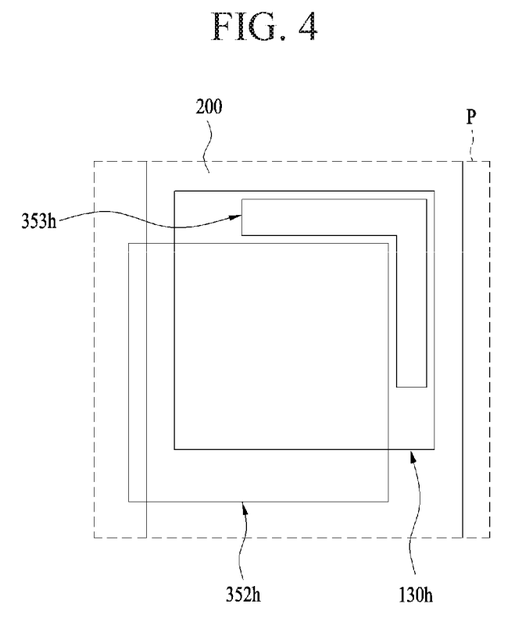
FIG. 4 is a plane view showing the region P of a display device according to another embodiment of the present disclosure.

The display device according to various embodiments of the present disclosure have been described as including the plurality of second bank penetrating hole 353h disposed along or adjacent to one or more side surfaces of the first bank penetrating hole 352h. However, the display device according to another embodiment of the present disclosure may include a single second bank penetrating hole 353h extending along or adjacent to one or more side surfaces of the first penetrating hole 352h, as shown in FIG. 4. The plane shape of the second bank penetrating hole 353h may be different from the plane shape of the first bank penetrating hole 352h, as shown. The plane shape of the second bank penetrating hole 353h may be a polygon of a type different from the plane shape of the first bank penetrating hole 352h.

Accordingly, in the display device according to embodiments of the present disclosure, since the adhesive layer 600 may quickly and easily flow into the under-cut region UC through the second bank penetrating hole 353h, which partially penetrates the under-cut region UC which is formed by the first bank penetrating hole 352h of the bank insulating layer 350 in order to connect the auxiliary electrode 200 to the upper electrode 330, the occurrence of voids may be reduced or prevented in the under-cut region UC due to the adhesive layer 600, so that the decrease of the quality and the luminance unevenness may be reduced or prevented.

Figure 5:
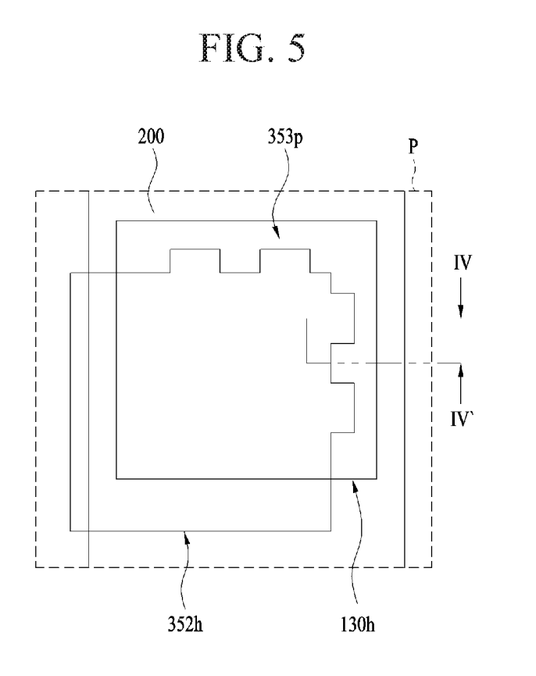
FIG. 5 is a plane view showing the region P of a display device according to another embodiment of the present disclosure.
Figure 6:
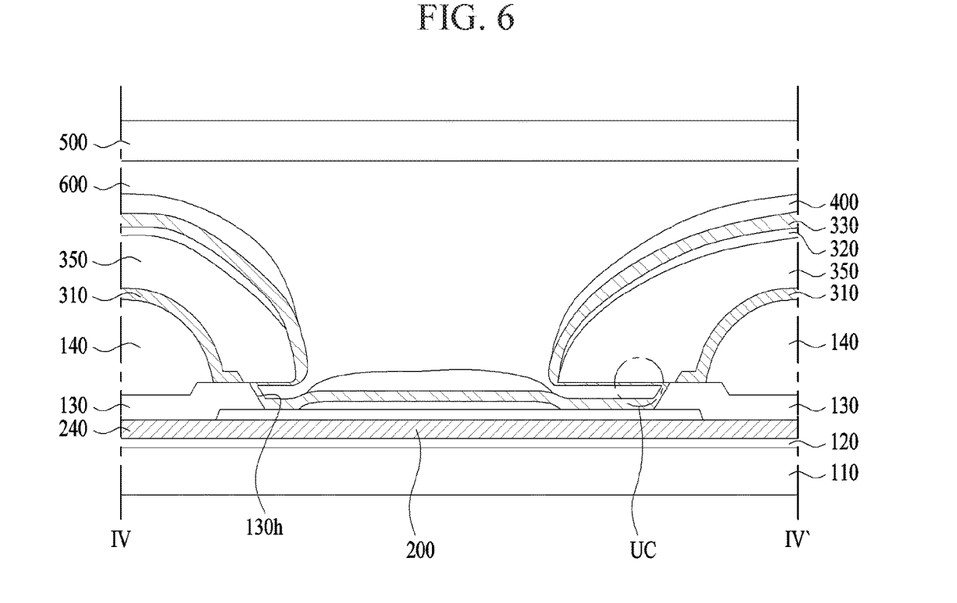
FIG. 6 is a cross-sectional view taken along IV-IV' of FIG. 5.

The display device according to embodiments of the present disclosure have been described such that the horizontal distance of the under-cut region UC is reduced by the second bank penetrating hole 353h of the bank insulating layer 350 overlapping with the lower penetrating hole 130h. However, in the display device according to another embodiment of the present disclosure, a perimeter of the first bank penetrating hole 352h of the bank insulating layer 350 disposed overlapping the lower penetrating hole 130h may have one or more protruding portions 353p, as shown in FIGS. 5 and 6. The protruding portions 353p extend the perimeter of the first bank penetrating hole 352h outwardly beyond the adjacent perimeter portions, such that the perimeter of the first bank penetrating hole 352h has a stepped shape, with an alternating arrangement of protruding portions 353p and non-protruding portions. A side surface of the lower penetrating hole 130h that is adjacent to the perimeter of the first bank penetrating hole 352h having the protruding portions 353p may have a straight shape. Thus, in the display device according to embodiments of the present disclosure, the under-cut region UC formed by the first bank penetrating hole 352h of the bank insulating layer 350 may include regions having a relatively short horizontal length and regions having a relatively long horizontal length, which are repeated or alternately arranged. That is, in the display device according to one or more embodiments of the present disclosure, since the perimeter of the first bank penetrating hole 352h may have the stepped shape, the adhesive layer 600 may flow into the regions of the under-cut region UC having a relatively long horizontal length through the regions of the under-cut region UC having a relatively short horizontal length. Thereby, in the display device according to another embodiment of the present disclosure, the decrease of the quality and the luminance unevenness due to an un-filled region of the adhesive layer 600 may be prevented.

As a result, the display device according to embodiments of the present disclosure may include the under-cut region in which regions having a relatively short horizontal length are disposed repeatedly, so that the adhesive layer for attaching the upper substrate to the lower substrate may easily flow into the under-cut region. Thus, in the display device according to embodiments of the present disclosure, the occurrence of the void due to the adhesive layer in the under-cut region may be prevented or reduced. Thereby, in the display device according to embodiments of the present disclosure, the decrease of the quality and the luminance unevenness due to an un-filled region of the adhesive layer may be effectively prevented or reduced.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A display device, comprising:
   an auxiliary electrode on a first substrate;
   a passivation layer on the auxiliary electrode;
   a first hole extending through the passivation layer and overlying at least a portion of the auxiliary electrode;
   a bank insulating layer on the passivation layer;
   a first bank layer hole extending through the bank insulating layer and partially overlying the first hole;
   a second bank layer hole extending through the bank insulating layer and overlying the first hole, the second bank layer hole being spaced apart from the first bank layer hole; and
   an over-coat layer between the passivation layer and the bank insulating layer.

2. The display device according to claim 1, wherein a side surface of the second bank layer hole overlies the first hole.

3. The display device according to claim 1, wherein a plane size of the second bank layer hole is smaller than a plane size of the first bank layer hole.

4. The display device according to claim 3, wherein the second bank layer hole is positioned adjacent to a side surface of the first bank layer hole.

5. The display device according to claim 1, wherein a plane shape of the second bank layer hole is a polygon of a same type as a plane shape of the first bank layer hole.

6. The display device according to claim 5, wherein the plane shape of the first bank layer hole and the second bank layer hole is a rectangular shape.

7. The display device according to claim 1, wherein the first bank layer hole has a rectangular shape, and the second bank layer hole is positioned adjacent to a first side and a second side of the first bank layer hole.

8. The device according to claim 1, further comprising:
a second substrate on the bank insulating layer; and
an adhesive layer between the bank insulating layer and the second substrate,
wherein the adhesive layer extends between the auxiliary electrode and the bank insulating layer through the first bank layer hole and the second bank layer hole.

9. The device according to claim 1, further comprising:
a light-emitting layer on a first portion of the auxiliary electrode in the first hole; and
a second electrode on the light-emitting layer, the second electrode contacts a second portion of the auxiliary electrode in the first hole.

10. The device according to claim 9, wherein the light-emitting layer is discontinuous in an undercut region between the bank insulating layer and the auxiliary electrode.

11. A display device, comprising:
an auxiliary electrode on a substrate;
a passivation layer on the auxiliary electrode;
a first hole extending through the passivation layer and exposing the auxiliary electrode;
a bank insulating layer on the passivation layer; and
a second hole extending through the bank insulating layer and overlapping the auxiliary electrode, a perimeter of the second hole overlapping the first hole,
wherein the perimeter of the second hole includes one or more protruding portions that extend the perimeter of the second hole outwardly in relation to adjacent portions of the perimeter.

12. The display device according to claim 11, wherein the first hole includes a side surface that is adjacent to the one or more protruding portions of the perimeter of the second hole, and
wherein the side surface of the first hole extends in a straight line adjacent to the one or more protruding portions.

13. The display device according to claim 11, further comprising a thin film transistor between the substrate and the passivation layer,
wherein the thin film transistor is spaced apart from the auxiliary electrode, and
wherein the auxiliary electrode includes a same material as one of a gate electrode, a source electrode and a drain electrode of the thin film transistor.

14. The display device of claim 13, further comprising:
a first electrode coupled to the drain electrode of the thin film transistor;
a light-emitting layer on the first electrode; and
a second electrode on the light-emitting layer, the second electrode contacting the auxiliary electrode in the first hole.

15. A display device, comprising:
a first substrate;
an auxiliary electrode on the first substrate;
a passivation layer on the auxiliary electrode, the auxiliary electrode being exposed by a first hole that extends through the passivation layer;
a bank insulating layer on the passivation layer;
a second hole that extends through the bank insulating layer over a first portion of the auxiliary electrode;
an undercut region between the bank insulating layer and a second portion of the auxiliary electrode, the bank insulating layer having a portion that overlies the second portion of the auxiliary electrode in the undercut region; and
a third hole that extends through the bank insulating layer in the undercut region.

16. The display device according to claim 15, further comprising a plurality of third holes extending through the bank insulating layer in the undercut region.

17. The display device according to claim 16, wherein a first portion of the plurality of third holes are disposed adjacent to a first side of the second hole, and a second portion of the plurality of third holes are disposed adjacent to a second side of the second hole.

18. The display device according to claim 15, further comprising:
a second substrate on the bank insulating layer; and
an adhesive layer between the bank insulating layer and the second substrate, the adhesive layer extending into the undercut region through the second hole and the third hole.

19. The display device according to claim 15, further comprising
a transistor on the first substrate;
a first electrode coupled to the transistor;
a light-emitting layer on the first electrode; and
a second electrode on the light-emitting layer, the second electrode contacts the second portion of the auxiliary electrode in the undercut region.

20. The display device according to claim 19, wherein the light-emitting layer is discontinuous in the undercut region.

* * * * *